(12) United States Patent
Yin et al.

(10) Patent No.: US 8,420,490 B2
(45) Date of Patent: Apr. 16, 2013

(54) HIGH-PERFORMANCE SEMICONDUCTOR DEVICE AND METHOD OF MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 167 days.

(21) Appl. No.: 12/999,086

(22) PCT Filed: Jun. 25, 2010

(86) PCT No.: PCT/CN2010/074458
§ 371 (c)(1),
(2), (4) Date: Dec. 15, 2010

(87) PCT Pub. No.: WO2011/066746
PCT Pub. Date: Jun. 9, 2011

(65) Prior Publication Data
US 2011/0227144 A1    Sep. 22, 2011

(30) Foreign Application Priority Data
Dec. 4, 2009   (CN) .......................... 2009 1 0242097

(51) Int. Cl.
*H01L 21/336*       (2006.01)
(52) U.S. Cl.
USPC ........... 438/289; 438/301; 438/302; 438/217; 438/219; 438/229; 257/327; 257/347; 257/288; 257/E29.242; 257/E21.435

(58) Field of Classification Search .................. 257/327, 257/347, 288, E29.242, E29.266, E21.435; 438/289, 302, 217, 219, 229, 301, 216
See application file for complete search history.

(56) References Cited

U.S. PATENT DOCUMENTS

2001/0009292 A1* 7/2001 Nishinohara et al. ......... 257/402
2011/0073961 A1* 3/2011 Dennard et al. .............. 257/408
2011/0281409 A1* 11/2011 Ellis-Monaghan et al. .. 438/229

* cited by examiner

*Primary Examiner* — Cathy N Lam
(74) *Attorney, Agent, or Firm* — Troutman Sanders LLP

(57) ABSTRACT

The present invention relates to a method of manufacturing a semiconductor device, and the method uses the mode of thermal annealing the source/drain regions and performing Halo ion implantation to form a Halo ion-implanted region by: first removing the dummy gate to expose the gate dielectric layer to form an opening; then performing a tilted Halo ion implantation to the device from the opening to form a Halo ion-implanted region on both sides of the channel of the semiconductor device; and then annealing to activate the dopants in the Halo ion-implanted region; finally performing subsequent process to the device according to the requirement of the manufacture process. Through the present invention, the dopants in the Halo ion-implanted region improperly introduced to the source region and the drain region may be reduced, and then the overlap between the Halo ion-implantation region and the dopant region of the source/drain regions may be reduced, thus to reduce the band-band leakage current in the MOSFET, and hence improve the performance of the device.

12 Claims, 9 Drawing Sheets

HIGH-PERFORMANCE SEMICONDUCTOR DEVICE AND METHOD OF MANUFACTURING THE SAME

BENEFIT CLAIMS

This application is a U.S. National Stage of International Application No. PCT/CN2010/074458, filed Jun. 25, 2010, which claims the benefit of CN 200910242097.6,filed Dec. 4, 2009.

FIELD OF THE INVENTION

The present invention generally relates to a semiconductor device and a method of manufacturing the same, and more specifically, to a semiconductor device for reducing improper dopants introduced to the source and drain regions by the Halo ion-implanted region on both sides of a channel and a method of manufacturing the same.

BACKGROUND OF THE INVENTION

With the development of the semiconductor industry, integrated circuits with higher performance and more powerful functions require greater element density. Thus, the sizes of the components need to be scaled further. Accordingly, in order to improve the performance of the Metal Oxide Semiconductor Field Effect Transistor (MOSFET), the gate length of the MOSFET should be further reduced. However, with the continuous reduction of the gate length, when the gate length is reduced to approach the width of the depletion layer of the source and the drain, for example less than 40 nm, severe short channel effects (SCE) occur, which disadvantageously leads to deterioration of device performance and difficulty for large scale production of integrated circuit. It has become a challenge in large scale production of integrated circuits to reduce and effectively control the short channel effects. It is described in pages 1-19 of the Article written by Thompson S et al.: "MOS Scaling: Transistor Challenges for the $21^{st}$ Century", Intel Technology Journal Q3'98, that Halo ion implantation and retrograded well can alleviate short channel effects. In the prior art, the dopants are often improperly introduced into the main parts of the source region and the drain region by the Halo ion implantation to be overlapped with the doping in the source/drain regions, causing increase in the band-band leakage current and source and drain junction capacitance in the MOSFET devices, thus results in deterioration of device performance.

Therefore, in order to improve the manufacture of high-performance semiconductor devices, there is a need for a semiconductor device and method for manufacturing the same to reduce improper doping to the source and drain regions during formation of a Halo ion implantation.

SUMMARY OF THE INVENTION

In view of the above-mentioned problems, the present invention proposes a method of manufacturing a semiconductor device. The method comprises: a) providing a substrate; b) forming a source region, a drain region, a gate stack, sidewall spacers and an interlayer dielectric layer on the substrate, wherein the gate stack is between the source region and the drain region on the substrate, the sidewall spacers are on the sidewalls of the gate stack, the interlayer dielectric layer covers the source region and drain region, and the gate stack includes a gate dielectric layer and a dummy gate; c) removing the dummy gate to expose the gate dielectric layer to form an opening; d) performing a tilted Halo ion implantation to the device to form a Halo ion-implanted region on both sides of the channel of the semiconductor device; f) thermal annealing to activate the dopants in the Halo ion-implanted region; g) performing subsequent process to the device. The quality of the gate dielectric layer may be affected by the Halo ion implantation and thermal annealing. In view of degradation of the gate dielectric layer after thermal annealing the Halo ion-implanted region, alternatively a metal gate may be directly formed on the gate dielectric layer. If the degradation of the gate dielectric layer is rather severe, the gate dielectric layer may be removed to expose the substrate, so as to form a new gate dielectric layer and metal gate in the opening, and the new gate dielectric layer covers the inner surfaces of the sidewall spacers.

Furthermore, the following alternate method may be used to manufacture a semiconductor device: a) providing a substrate; b) forming a source region, a drain region, a gate stack, sidewall spacers and an interlayer dielectric layer on the substrate, wherein the gate stack is between the source region and the drain region on the substrate, the sidewall spacers are formed on the sidewalls of the gate stack, the interlayer dielectric layer covers the source region and drain region, and the gate stack includes a gate dielectric layer and a dummy gate; c) removing the gate dielectric layer and the dummy gate to expose the substrate to form an opening; d) performing a tilted Halo ion implantation to the device to form a Halo ion-implanted region on both sides of the channel of the semiconductor device; e) thermal annealing to activate the dopants in the Halo ion-implanted region; f) performing subsequent process to the device. The subsequent process comprises: forming a new gate dielectric layer and metal gate in the opening, wherein the new gate dielectric layer covers the inner surfaces of the sidewall spacers.

In accordance with another aspect of the present invention, t a semiconductor device is further provided, comprising a substrate, a source region, a drain region, a gate stack, sidewall spacers and an interlayer dielectric layer on the substrate, wherein the gate stack is between the source region and the drain region on the substrate, the sidewall spacers are formed on the sidewall of the gate stack, and the interlayer dielectric layer covers the source region and drain region, wherein the gate stack includes a gate dielectric layer and a metal gate, and the semiconductor device further includes the Halo ion-implanted region formed on both sides of the channel of the semiconductor device.

DETAILED DESCRIPTION OF THE INVENTION

The present invention generally relates to a method of manufacturing a semiconductor device. The following disclosure provides a plurality of different embodiments or examples to achieve different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

FIRST EMBODIMENT

Figure 1:
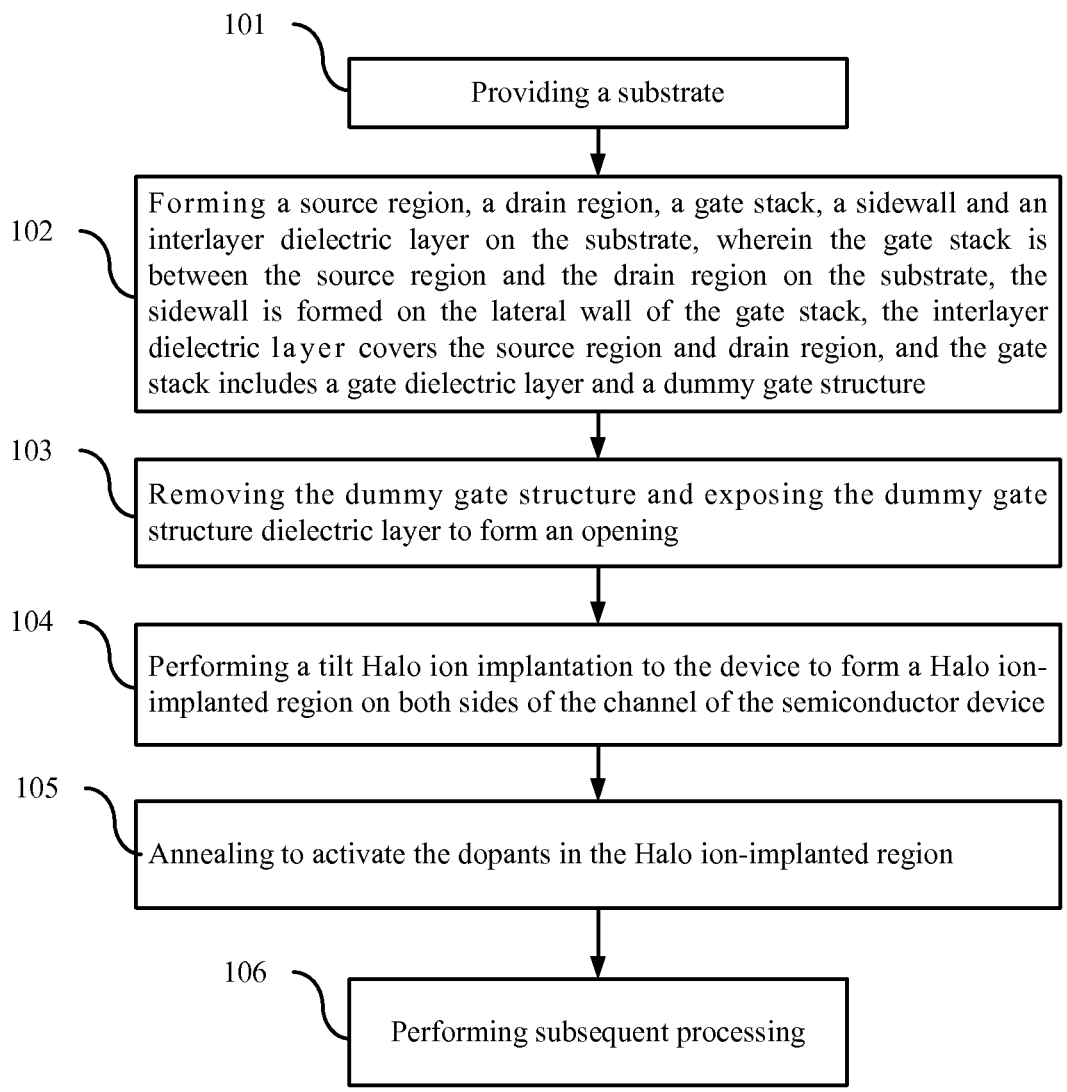
FIG. 1 is a flowchart illustrating a method of manufacturing a semiconductor device according to the first embodiment of the present invention.
Figure 2:
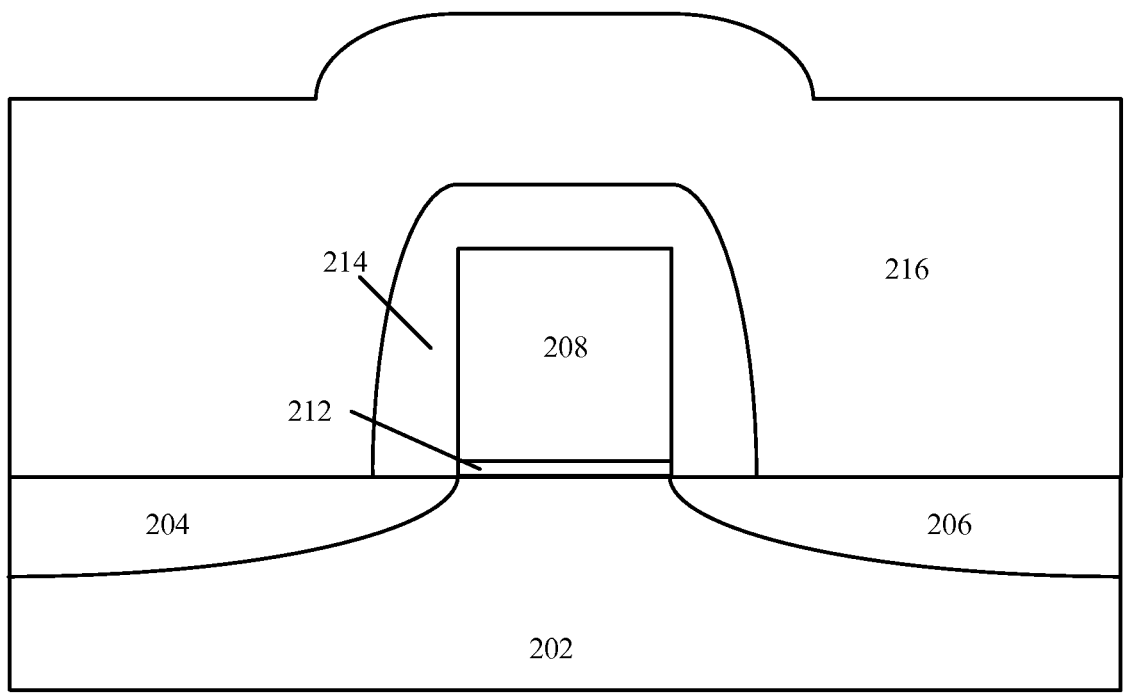
FIGS. 2-11 are schematic diagrams illustrating the stages for manufacturing a semiconductor device according to the first embodiment of the present invention.

According to the first embodiment of the present invention, with reference to FIG. 1, FIG. 1 is a flowchart illustrating a method of manufacturing a semiconductor device according to the first embodiment of the present invention. In step 101, a semiconductor substrate 202 is provided, as shown in FIG. 2. In this embodiment, the substrate 202 includes a crystalline silicon substrate (for example a wafer). According to the design specifications known in the prior art (for example, a p-type substrate or an n-type substrate), the substrate 202 may be of various doping configurations. Other examples of the substrate 202 may also include other semiconductor, for example germanium and diamond. Alternatively, the substrate 202 may include compound semiconductors, such as SiC, GaAs, and InAs or InP. In addition, the substrate 202 may include an epitaxial layer, may be under stress to enhance performance, and/or may include a SOI (silicon on insulator) structure.

In step 102, a source region 204, a drain region 206, a gate stack 30, and sidewall spacers 214 are formed on the substrate 202, wherein the gate stack 30 is between the source region 204 and the drain region 206 on the substrate, the sidewall spacers 214 are formed on the sidewalls of the gate stack 30. The gate stack 30 includes a gate dielectric layer 212 and a dummy gate 208.

The gate dielectric layer 212 may be thermal oxide layer, including silicon oxide, silicon nitride, for example, $SiO_2$. The dummy gate 208 is a sacrificial layer. The dummy gate 208 may be, for example, polysilicon. In one embodiment, the dummy gate 208 may include amorphous silicon. The gate dielectric layer 212 and the dummy gate 208 may be formed by a traditional Metal Oxide Semiconductor (MOS) process, such as deposition, lithography, etching, and/or other appropriate methods.

The source region 204 and the drain region 206 may be formed by implanting, depending on desired transistor structure, p-type or n-type dopants into the substrate 202. The source region 204 and the drain region 206 may be formed by a method including lithography, ion implantation, diffusion and/or other process as appropriate. The source region 204 and drain region 206 may be formed after the formation of the gate dielectric layer 212 by using common semiconductor processes and steps. The device may be subjected to thermal annealing to activate the dopants in the source region 204 and the drain region 206, wherein the thermal annealing may be performed by using rapid thermal annealing, spike annealing and other processes that are known to a person of ordinary skill in the art.

Sidewall spacers 214 are formed, covering the gate stack 30. The sidewall spacers 214 may be formed of silicon nitride, silicon dioxide, silicon oxynitride, silicon carbide, fluorine-doped silicate glass, low-k dielectric materials, and/or other materials as appropriate and any combination thereof. The sidewall spacers 214 may have a multilayer structure. The sidewall spacer 214 may be formed by appropriate methods, including depositing appropriate dielectric materials. A section of the sidewall spacer 214 covers the gate stack 30, and such a structure may be achieved by using the technology known to a person of ordinary skill in the art. In other embodiments, the sidewall spacers 214 may not cover the gate stack 30.

In particular, an Interlayer Dielectric Layer (ILD) 216 may be formed by deposition on the substrate. The interlayer dielectric layer may be, but not limited to, for example, undoped $SiO_2$, doped $SiO_2$ (for example borosilicate glass, boron-phosphorosilicate glass) and $Si_3N_4$. The interlayer dielectric layer 216 may be formed by using a method such as chemical vapor deposition (CVD), physical vapor deposition (PVD), atomic layer deposition (ALD) and/or other process as appropriate. The interlayer dielectric layer may have a multilayer structure. In one embodiment, the thickness of the interlayer dielectric layer 216 is in a range from about 30 nm to 90 nm.

Figure 3:
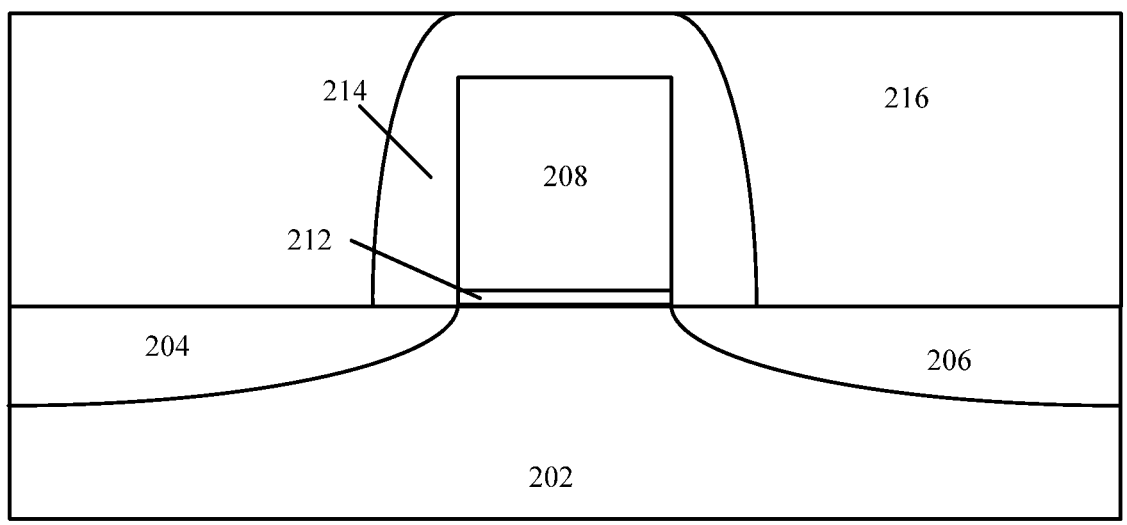
Figure 4:
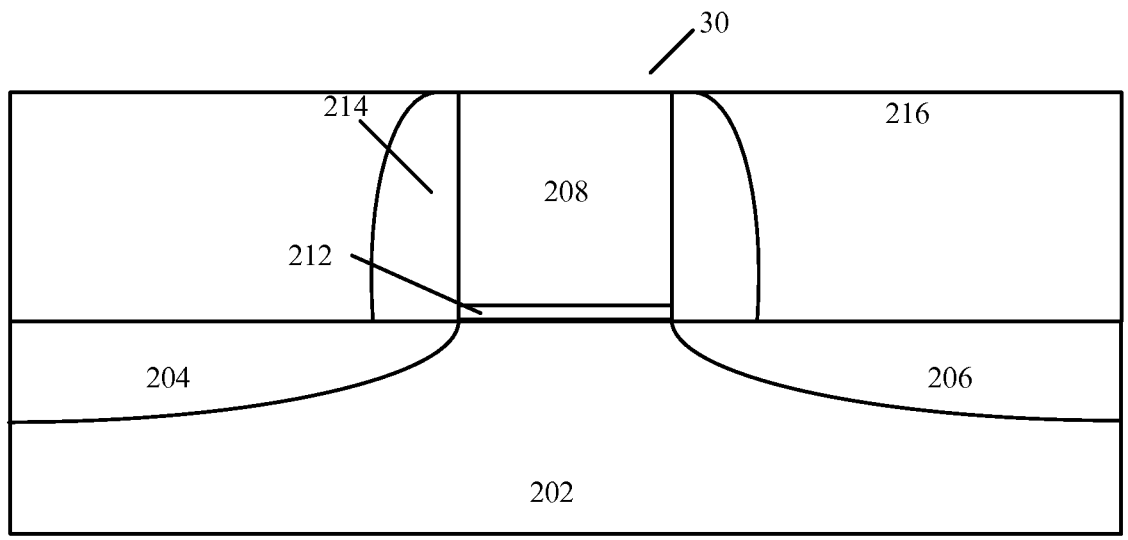

Then, the interlayer dielectric layer 216 and the sidewall spacer 214 may be planarized, for example, by Chemical-Mechanical Polishing (CMP) process until the upper surface of the dummy gate 208 is exposed, as illustrated in FIG. 3. Then, Chemical-Mechanical Polishing or Reactive Ion Etching is performed to the sidewall spacers 214 to remove the upper surface of the sidewall spacer 214, so as to expose the dummy gate 208, as shown in FIG. 4.

Figure 5:
Figure 5:
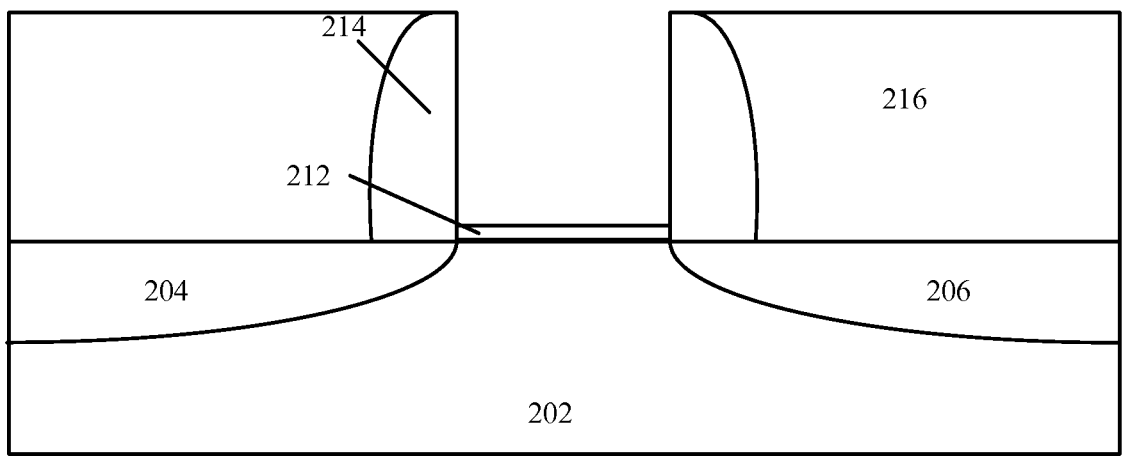

The flow then goes to step 103 in which the dummy gate 208 is removed to expose the gate dielectric layer 212 to thereby form an opening 220, as shown in FIG. 5. For example, by selectively etching polysilicon and stopping on the gate dielectric layer 212, the dummy gate 208 is removed and the opening 220 is formed. The dummy gate 208 may be removed by using wet etching and/or dry etching. In one embodiment, the wet etching process may include tetramethylammonium hydroxide (TMAH), KOH or other etchant solutions as appropriate.

Figure 6:
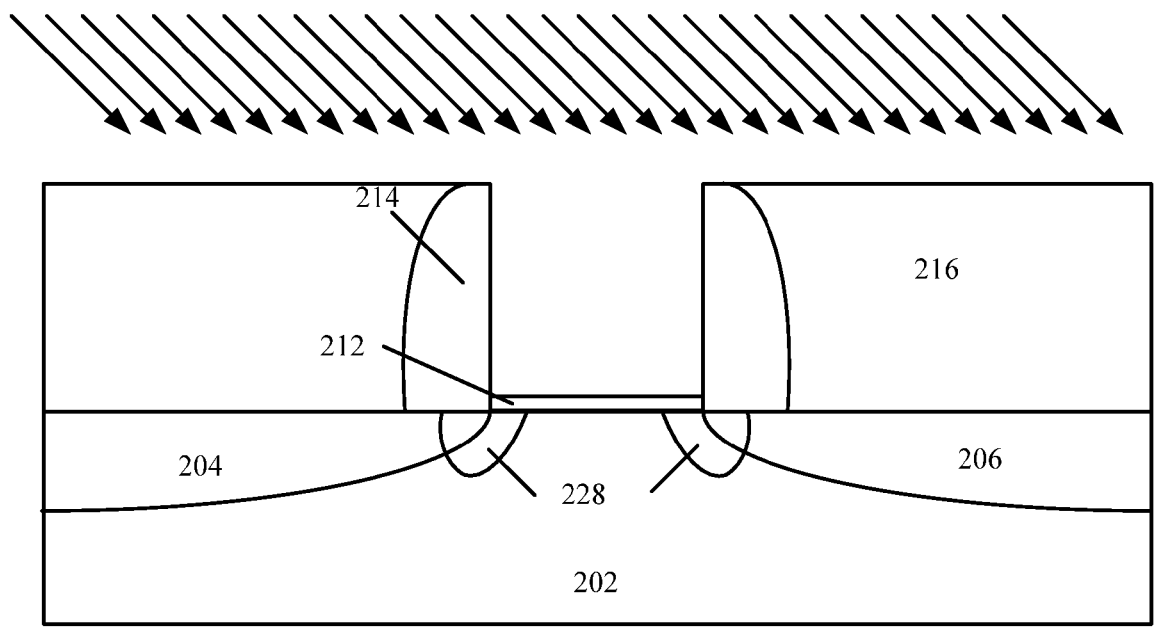

In step 104, by tilted Halo ion implantation to the device, a Halo ion-implanted region 228 is formed on both sides of the channel of the semiconductor device, as shown in FIG. 6.

For an n-type semiconductor device, the dopant implantation is performed using at least one of group III elements including boron, boron difluoride and indium. The energy of ion implantation is in the range of 20-60 keV, the implantation dose is 5e12-6e13. For a p-type semiconductor device, the dopant implantation is performed using group V elements, for example phosphorus and arsenic. The energy of ion implantation is in the range of 20-60 keV, the implantation dose is 5e12-6e13.

For example, a symmetrical Halo ion implantation may be performed to the device twice at an angle of about 20-70 degrees with respect to the vertical direction so as to form the Halo ion-implanted region 228 on both sides of the channel region of the substrate. The Halo ion-implanted region is determined by the width and the height of the opening 220, the energy and angle of ion implantation as well as the ability of ions penetrating the sidewall spacers 214 and the dielectric layer 216. As the angle with respect to the vertical direction increases, the Halo ion-implanted region will move from the middle of the channel to both sides of the channel, and the depth of the Halo ion-implanted region reduces as well. Therefore, the energy and angle of the Halo ion implantation are designed according to the requirement of controlling the short channel effects of the device in the embodiment. Supposing that the angle with respect to the vertical direction for performing the symmetrical Halo ion implantation twice is not wide, the two Halo ion-implanted regions in the channel are close to the middle of the channel, an overlap may occur. The width of a single Halo ion-implanted region is generally less than 1.5 times the width of the opening 220.

Subsequently, in step 105, the device is thermally annealed so as to activate the dopants in the Halo ion-implanted region. For example, rapid thermal annealing may be used, and in other embodiments, other annealing process may be used. In to this step, the activation requirement and diffusion effect on the dopants of the source and drain regions as well as the source and drain extension regions should be further taken into account. If the dopants of the source and drain region as well as the source and drain extension regions are still not activated, this step may be used to perform annealing conveniently for the purpose of activation. According to the embodiments of the present invention, the device is typically annealed by spike annealing process, for example annealing for 0.5 to 2 seconds at a temperature of not less than about 1000.

Figure 7:
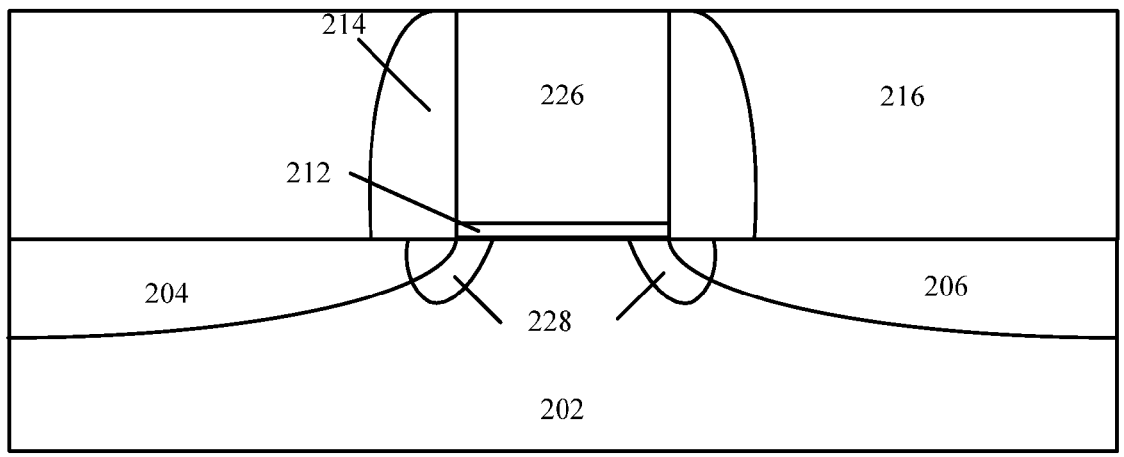

Then, in step 106, a further process may be performed to the device according to the requirement of manufacture. For example, a metal gate 226 may be formed in the opening, as shown in FIG. 7. Preferably, after the gate dielectric layer 212 is formed, the work function metal gate layer may be deposited thereon. The work function metal gate layer may have a thickness in a range from about 10 Å to about 100 Å. The materials used for the work function metal gate layer may include TiN, TiAlN, TaN and TaAlN.

Next, a metal gate 226 is formed on the gate dielectric layer 212, as shown in FIG. 7. The metal gate 226 may include one or more layers, for example, liners, layers of materials with suitable work function, a gate electrode layer and/or other layers as appropriate may form the gate 226. For an n-type semiconductor device, one or more materials may be deposited selecting from the following group comprising TiN, TiAlN, TaAlN, TaN, TaSiN, HfSiN, MoSiN, RuTa$_x$, NiTa$_x$, and any combination thereof. For a p-type semiconductor device, one or more materials may be deposited selecting from the following group comprising TiN, TiSiN, TiCN, TaAlC, TiAlN, TaN, PtSi$_x$, Ni$_3$Si, Pt, Ru, Ir, Mo, HfRu, RuO$_x$, and any combination thereof.

Finally, chemical mechanical polishing (CMP) process is performed to form the metal gate 226.

Figure 8:
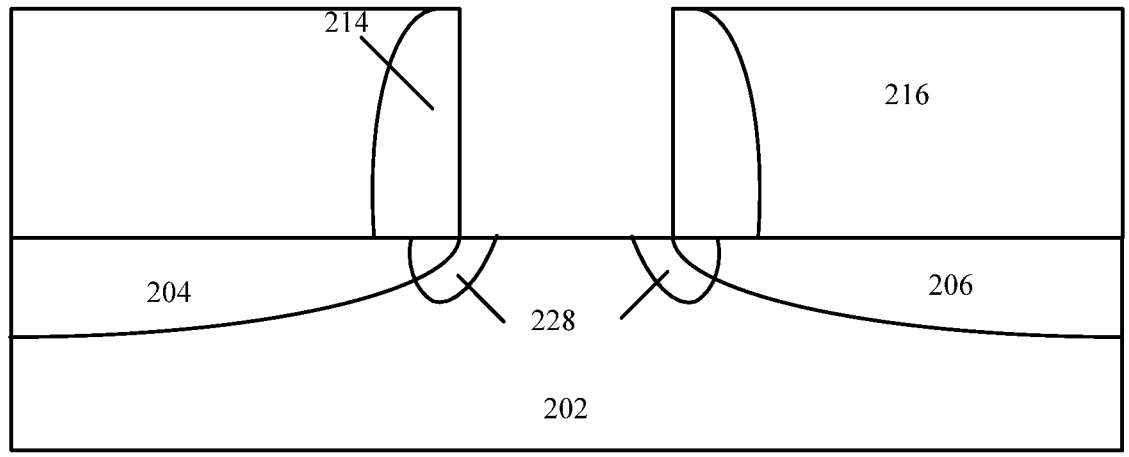

Particularly, unacceptable deterioration to the gate dielectric layer may be caused by the Halo ion implantation and the thermal annealing process of the Halo ion implantation. Alternatively, the gate dielectric layer 212 may be removed after Halo ions implantation, as shown in FIG. 8. For example, it may be removed by using wet etching and/or dry etching. In one embodiment, hydrofluoric acid (HF) or other suitable etchant solutions may be used. Then, a new gate dielectric layer is formed. Thus, the gate dielectric layer 212 may be removed after Halo ions implantation. In other embodiments, the gate dielectric layer 212 may also be removed after annealing the Halo ion-implanted region in the next step.

When the dielectric layer 212 is removed, a new gate dielectric layer 224 and a metal gate 226 may be formed in the opening after annealing the Halo ion-implanted region, and the new gate dielectric layer 224 covers the inner surfaces of the substrate 202 and sidewall spacers 214.

Figure 9:
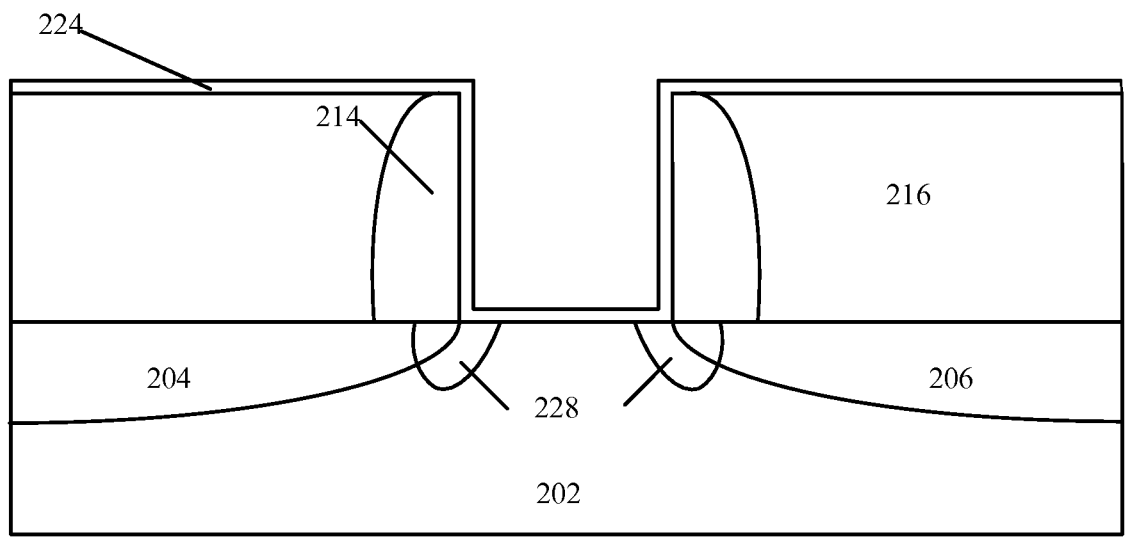

As shown in FIG. 9, a new gate dielectric layer 224 may be deposited, and the gate dielectric layer 224 covers the substrate and the inner surfaces of the sidewall spacers. The gate dielectric layer 224 is a high dielectric constant (high k) material. In one embodiment, the high-k materials may include hafnium dioxide (HfO$_2$). Other examples of high-k materials may include HfSiO, HfSiON, HfTaO, HfTiO, HfZrO, and/or other appropriate materials and any combination thereof. The gate dielectric layer 224 may have a thickness in a range from about 12 Å to 35 Å. The gate dielectric layer 212 may be formed by such techniques as chemical vapor deposition (CVD) or atomic layer deposition (ALD). The gate dielectric layer 224 may have a multilayer structure, including more than one layer of above-mentioned materials.

Preferably, after the gate dielectric layer 224 is formed, the work function metal gate layer may be deposited thereon. The work function metal gate layer may have a thickness in a range from about 10 Å about 100 Å. The materials used for the work function metal gate layer may include TiN, TiAlN, TaN and TaAlN.

Preferably, when the new gate dielectric layer 224 is formed, a step of annealing process may be added, so as to improve the quality of the gate dielectric layer 224, and the temperature of annealing is in a range from 600 to 800° C.

Figure 10:
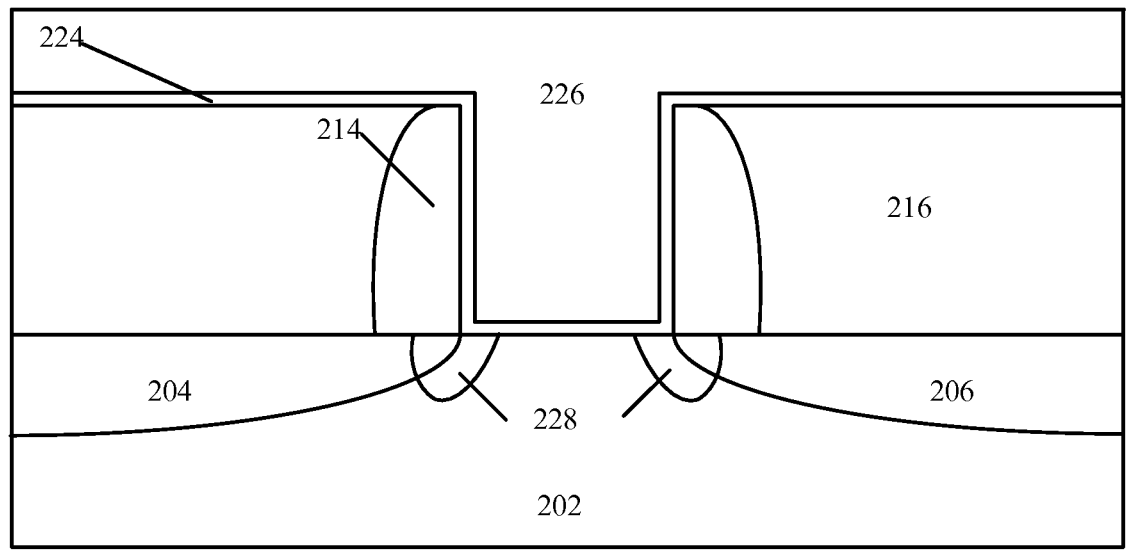

Next, a metal gate 226 is formed on the gate dielectric layer 224, as shown in FIG. 10. The metal gate 226 may include one or more material layers, for example liners, so as to provide materials with suitable work functions and/or other materials as appropriate to the gate. For an n-type semiconductor device, one or more materials may be deposited selecting from the following group comprising TiN, TiAlN, TaAlN, TaN, TaSiN, HfSiN, MoSiN, RuTa$_x$, NiTa$_x$, and any combination thereof. For a p-type semiconductor device, one or more materials may be deposited selecting from the following group comprising TiN, TiSiN, TiCN, TaAlC, TiAlN, TaN, PtSi$_x$, Ni$_3$Si, Pt, Ru, Ir, Mo, HfRu, RuO$_x$, and any combination thereof.

Figure 11:
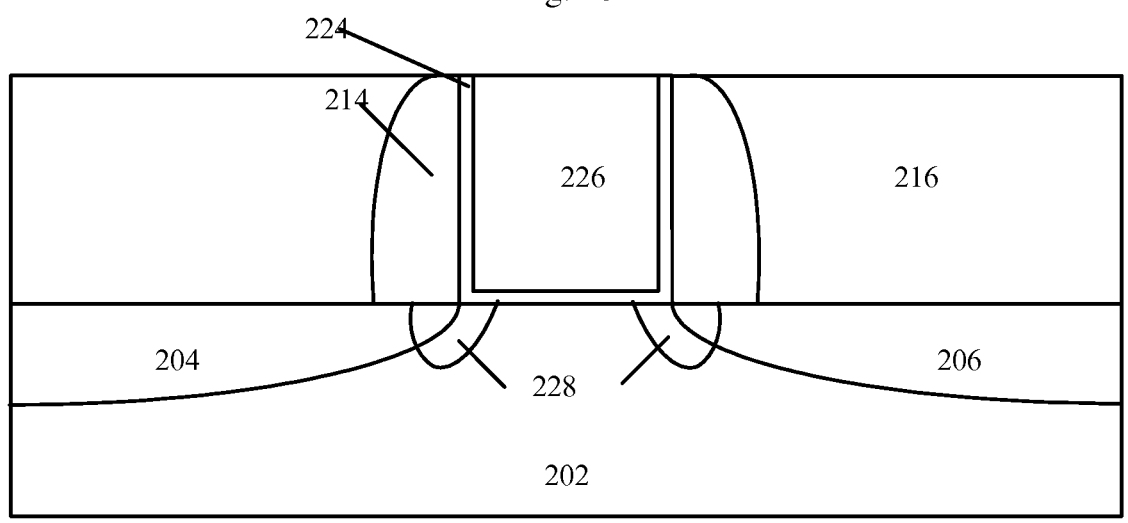

Finally, chemical mechanical polishing (CMP) process is performed to form the metal gate 226, as shown in FIG. 11.

That is, if the gate dielectric is not greatly affected by the Halo ion implantation and the thermal annealing process of the Halo ion implantation, the gate dielectric in the above-mentioned first embodiment may function as the gate dielectric of the device, thus the gate dielectric layer of the device may be retained. That is, the gate dielectric is not removed, and a metal gate is formed after performing annealing activation, and therefore there is no gate dielectric layer on the sidewalls of the sidewall spacers 214. If the gate dielectric is affected by the Halo ion implantation and the thermal annealing process of the Halo ion implantation and becomes unacceptable, the gate dielectric layer 212 may be optionally removed before or after annealing the Halo ion-implanted region, and new gate dielectric layer and metal gate are formed after annealing the device, thus there will be a gate dielectric layer on the sidewalls of the sidewall spacers 214.

SECOND EMBODIMENT

Figure 12:
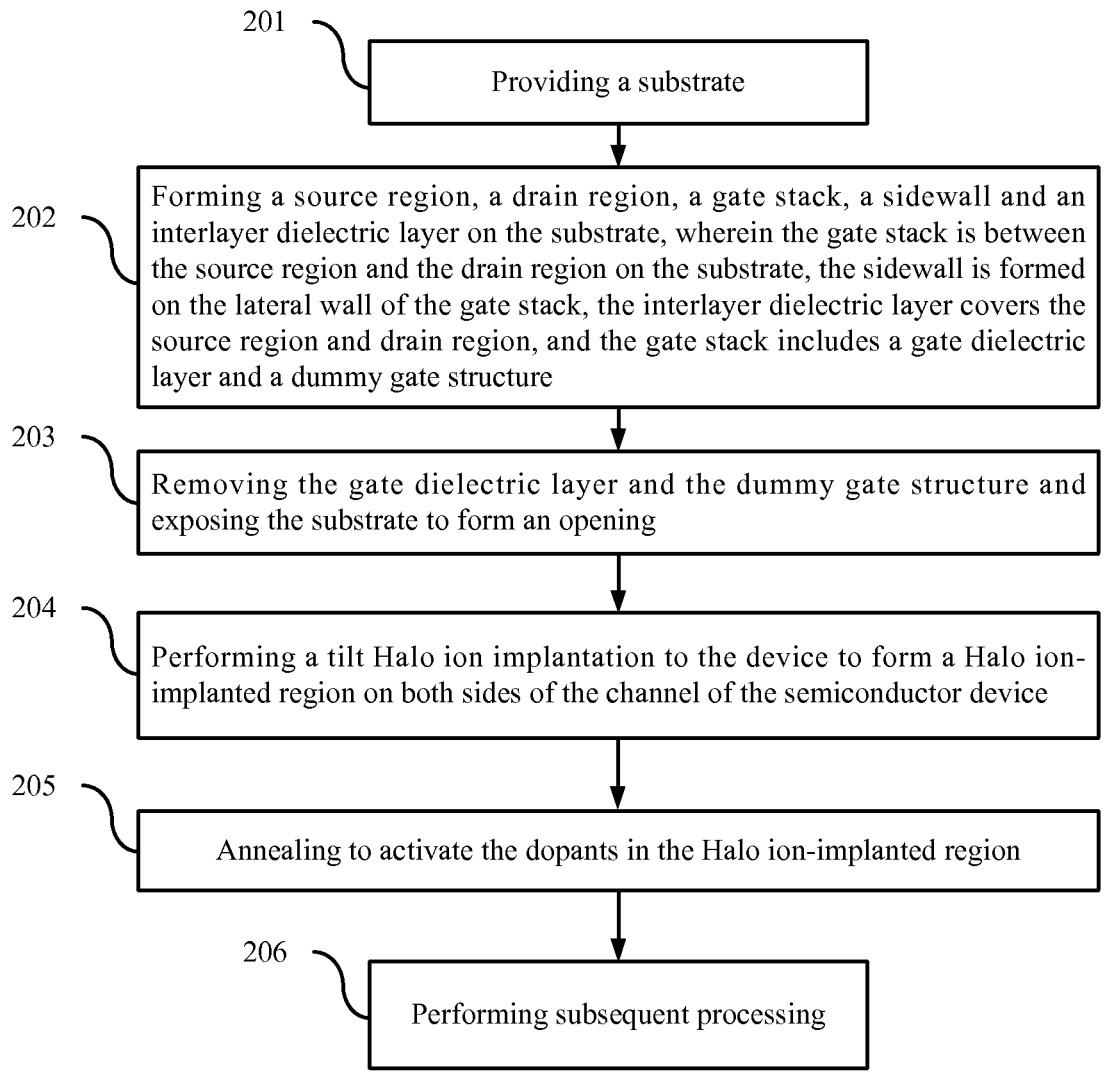
FIG. 12 is a flowchart illustrating a method of manufacturing a semiconductor device according to the second embodiment of the present invention.
Figure 13:
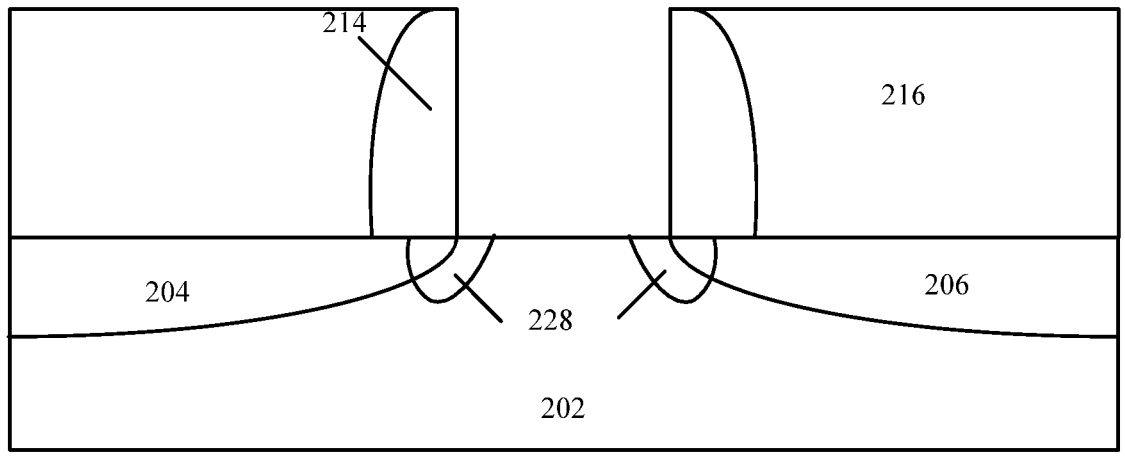
FIGS. 13-15 are schematic diagrams illustrating the stages for manufacturing a semiconductor device according to the second embodiment of the present invention.

Hereinafter, it only will set forth the aspects that the second embodiment distinguishes from the first embodiment. The parts that are not described should be deemed to be carried out by using the same steps, methods or processes as the first embodiment, and it is unnecessary to give more details. In the second embodiment of the present invention, as shown in FIG. 12, in step 203, the gate dielectric layer 212 and the dummy gate 208 may be removed together to expose the substrate 202, so as to form an opening 220, as shown in FIG. 13. The dummy gate 208 and the gate dielectric layer 212 may be removed by using wet etching and/or dry etching.

Figure 14:
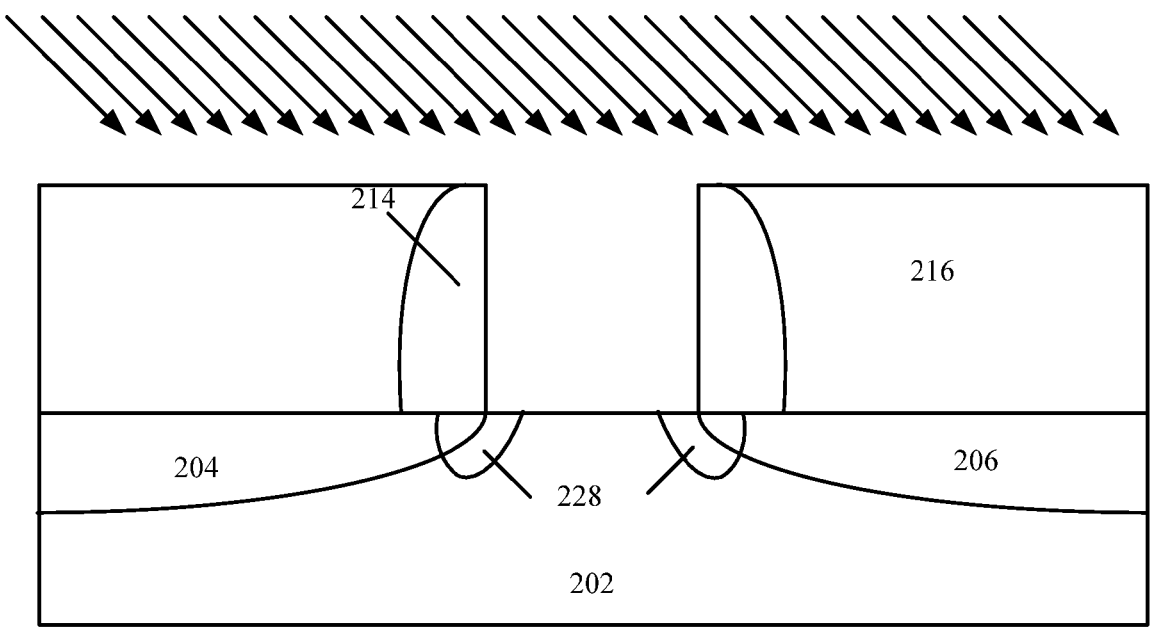
Figure 15:
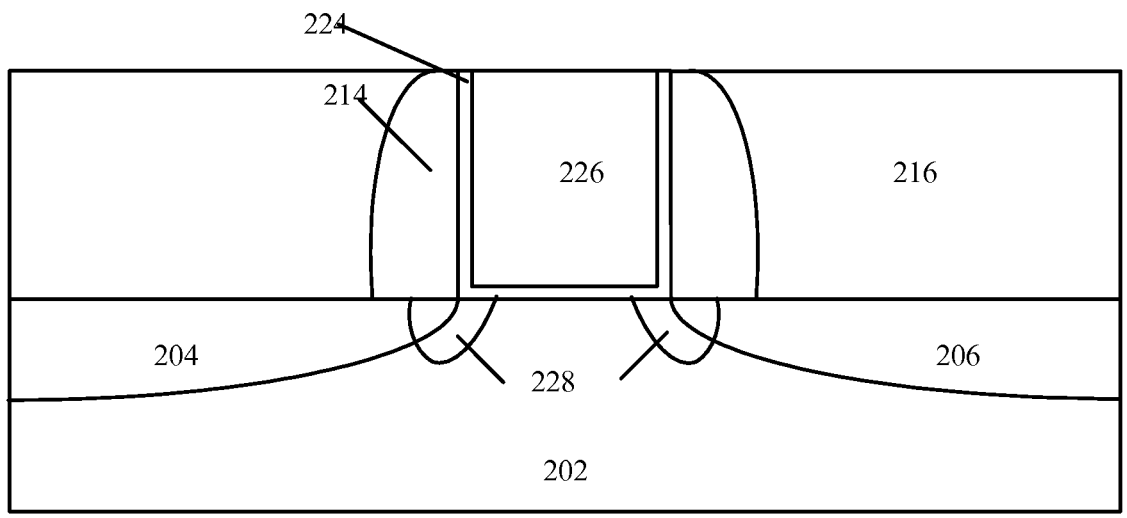

Then, identical to steps in the first embodiment, in step 204, as shown in FIG. 14, a tilted Halo ion implantation is performed to the device to form the Halo ion-implanted region 228 on both sides of the channel of the semiconductor device. For an n-type semiconductor device, the dopant implantation is performed using at least one of group III elements including boron, boron difluoride and indium. The energy of ion implantation is in the range of 20-60 keV, the implantation dose is 5e12-6e13. For a p-type semiconductor device, the dopant implantation is performed using group V elements, for example phosphorus and arsenic. The energy of ion implantation is in the range of 20-60 keV, the implantation dose is 5e12-6e13. A symmetrical Halo ion implantation may be performed to the device twice at an angle of 20-70 degrees with respect to the vertical direction so as to form a Halo ion-implanted region 228 on both sides of the channel region of the substrate. The Halo ion-implanted region is determined by the width and the height of the opening 220, the energy and angle of ion implantation as well as the ability of ions penetrating the sidewall spacers 214 and the dielectric layer 216. As the angle with respect to the vertical direction increases, the Halo ion-implanted region will move from the middle of the channel to both sides of the channel, and the depth of the Halo ion-implanted region reduces as well. Therefore, the energy and angle of the Halo ion implantation are designed according to the requirement of controlling the short channel effects of the device in the embodiment. Supposing that the angle with respect to the vertical direction for performing the symmetrical Halo ion implantation twice is not wide, the two Halo ion-implanted regions in the channel are close to the middle of the channel, an overlap may occur. The width of a single Halo ion-implanted region is generally less than 1.5 times the width of the opening 220.

Turning to step 205 directly, since the gate dielectric layer 212 has been removed from step 203, the device is annealed to activate the dopants in the Halo ion-implanted region. For example, rapid thermal annealing may be used, and in other embodiments, other annealing process may be used. If the dopants of the source and drain region as well as the source and drain extension regions are still not activated, this step may be used for the purpose of activation in the source and drain regions. According to the embodiments of the present invention, the device is typically annealed by spike annealing process, for example, annealing for 0.5 to 2 seconds at a temperature not less than about 1000.

Consequently, new gate dielectric layer 224 and metal gate 226 may be formed in the opening 222, and the gate dielectric layer 224 covers the substrate 202 and the inner surfaces of the sidewall spacers 214.

In accordance with the first and the second embodiments, it is set forth above the implementing method for avoiding introducing improper dopants to the source and drain regions when performing Halo ion implantation on the device.

In the embodiments of the present invention, Halo ion implantation is performed by using the opening formed by removing the dummy gate, so the overlap between the Halo ion-implantation region and the main part of the source region and the drain region is reduced, and the band-to-band leakage current in MOSFET devices may be reduced.

Furthermore, regarding the Halo ion implantation in the present invention, according to requirement, the present invention may choose the method of firstly annealing the source/drain regions and their extension areas, then performing Halo ion implantation, and then annealing Halo dopants to thereby avoid the impact on the Halo dopants by annealing the source/drain regions and their extension areas; to Halo ion implantation annealing may be separately conducted in consideration of the doping impact on the source/drain regions and their extension areas, so as to meet the requirements of activation and diffusion control of the Halo dopants.

Moreover, because the Halo ion implantation in the prior art is usually performed after formation of the gate dielectric, the ion implantation may lead to deterioration of gate dielectric and device performance disadvantageously. Whereas the present invention may use the method of performing Halo ion implantation prior to forming the gate dielectric and metal gate to avoid the above problem of deterioration of gate dielectric.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method of manufacturing a semiconductor device, comprising:
   a) providing a substrate;
   b) forming a source region, a drain region, a gate stack, sidewall spacers and an interlayer dielectric layer on the substrate, wherein the gate stack is between the source region and the drain region on the substrate, the sidewall spacers are on sidewalls of the gate stack, the interlayer dielectric layer covers the source region and the drain region, and the gate stack includes a gate dielectric layer and a dummy gate;
   c) removing the dummy gate to form an opening;
   d) after removing the dummy gate, performing a tilted Halo ion implantation to the semiconductor device to form Halo ion-implanted regions on both sides of a channel of the semiconductor device;
   e) removing the gate dielectric layer;
   f) performing thermal annealing to activate the dopants in the Halo ion-implanted region;
   g) performing subsequent process to the semiconductor device.

2. The method according to claim 1, wherein step g) comprises forming a metal gate in the opening.

3. The method according to claim 1, wherein step g) comprises forming a new gate dielectric layer and a metal gate in the opening, wherein the new gate dielectric layer covers the inner surfaces of the sidewall spacers.

4. The method according to claim 1, further comprising, prior to step d), annealing to activate the dopants in the source/drain regions.

5. The method according to claim 1, wherein step d) comprises: for an n-type semiconductor device, ion implantation is performed using at least one of group III elements including boron, boron difluoride and indium, an energy of ion implantation is in the range of 20-60 keV, and an implantation dose is 5e12-6e13.

6. The method according to claim 1, wherein step d) comprising: for a p-type semiconductor device, ion implantation is performed using group V elements including phosphorus and arsenic, an energy of ion implantation is in a range of 20-60 keV, and an implantation dose is 5e12-6e13.

7. The method according to claim 1, wherein the step of performing the tilted Halo ion implantation to the device comprising: performing two symmetrical Halo ion implantations to the device at an angle of 20-70 degrees with respect to a vertical direction.

8. The method according to claim 1, wherein a width of the Halo ion-implanted region on one side is less than 1.5 times a distance between the source region and the drain region.

9. The method according to claim 1, further comprising step e) of removing the gate dielectric layer after steps d) and f).

10. The method according to claim 1, wherein step c) further comprises the step of removing the gate dielectric layer.

11. The method according to claim 9, wherein step g) comprises forming a new gate dielectric layer and a metal gate in the opening, wherein the new gate dielectric layer covers inner surfaces of the sidewall spacers.

12. The method according to claim 10, wherein step g) comprises forming a new gate dielectric layer and a metal gate in the opening, wherein the new gate dielectric layer covers inner surfaces of the sidewall spacers.

* * * * *